United States Patent
Vilhelmsson (10) Patent No.: US 7,822,081 B2
(45) Date of Patent: Oct. 26, 2010

(54) RESONATOR (75) Inventor: Kenneth Vilhelmsson, Öjersjö (SE)

(73) Assignee: Alfa Exx AB, Partille (SE)

( * ) Notice: Subject to any disclaimer, the term of this patent is extended or adjusted under 35 U.S.C. 154(b) by 1401 days.

(21) Appl. No.: 10/455,296

(22) Filed: Jun. 6, 2003

(65) Prior Publication Data
US 2004/0004751 A1 Jan. 8, 2004

(30) Foreign Application Priority Data
Jun. 6, 2002 (SE) .................................. 0201732

(51) Int. Cl.
*H01S 3/10* (2006.01)
(52) U.S. Cl. ............................. 372/20; 372/19; 372/21; 372/29.023; 372/29.022
(58) Field of Classification Search .................. 372/19, 372/20, 32, 92, 98, 29.023, 29.022, 97; 359/333, 359/346, 330
See application file for complete search history.

(56) References Cited

U.S. PATENT DOCUMENTS

| | | | | |
|---|---|---|---|---|
| 4,860,296 A | * | 8/1989 | Chemla et al. | 372/44.01 |
| 5,050,179 A | | 9/1991 | Mooradian | |
| 5,387,998 A | * | 2/1995 | Kitaoka et al. | 359/328 |
| 5,461,635 A | * | 10/1995 | Basiev et al. | 372/42 |
| 5,677,920 A | * | 10/1997 | Waarts et al. | 372/6 |
| 5,887,009 A | * | 3/1999 | Mandella et al. | 372/6 |
| 5,982,545 A | * | 11/1999 | Su | 359/569 |
| 6,038,239 A | | 3/2000 | Gabbert | |
| 6,049,554 A | | 4/2000 | Lang et al. | |
| 6,081,539 A | * | 6/2000 | Mattori et al. | 372/20 |
| 6,192,062 B1 | * | 2/2001 | Sanchez-Rubio et al. | 372/92 |
| 6,252,897 B1 | | 6/2001 | Abe | |
| 6,301,274 B1 | * | 10/2001 | Tayebati et al. | 372/20 |
| 6,327,068 B1 | * | 12/2001 | Silberberg et al. | 359/239 |
| 6,608,847 B2 | * | 8/2003 | Zhang et al. | 372/20 |
| 6,658,031 B2 | * | 12/2003 | Tuganov et al. | 372/34 |
| 6,732,929 B2 | * | 5/2004 | Good et al. | 235/462.01 |
| 6,763,047 B2 | * | 7/2004 | Daiber et al. | 372/34 |
| 6,822,979 B2 | * | 11/2004 | Daiber | 372/20 |

(Continued)

FOREIGN PATENT DOCUMENTS

JP    59-205783    11/1984

(Continued)

OTHER PUBLICATIONS

Explanation of claim 63 by Inventor, May 12, 2010, pp. 1-3.*

(Continued)

*Primary Examiner*—Minsun Harvey
*Assistant Examiner*—Delma R Forde
(74) *Attorney, Agent, or Firm*—Harness, Dickey & Pierce, P.L.C.

(57) ABSTRACT

This invention relates to a wavelength tunable light source, comprising a main resonator, having a first and a second mirrored end, defining an effective cavity length, i.e. an optical beam path length of a resonant mode of the cavity, an optical gain element, having a first and a second opposing end surface, said second surface being positioned within said main resonator, a mirror element constituting said second mirrored end, and a dispersive focusing resonator element, being positioned along a beam path between said second end surface and said mirror element, whereby said effective cavity length of said main resonator is arranged to be varied.

61 Claims, 6 Drawing Sheets

U.S. PATENT DOCUMENTS

| | | | |
|---|---|---|---|
| 2002/0024978 A1* | 2/2002 | Inagaki et al. | 372/20 |
| 2002/0080833 A1* | 6/2002 | Matsuura et al. | 372/20 |
| 2002/0101632 A1* | 8/2002 | Meckler | 359/115 |
| 2003/0169498 A1* | 9/2003 | Hendriks et al. | 359/566 |
| 2004/0136433 A1* | 7/2004 | Kuznetsov | 372/92 |
| 2004/0264515 A1* | 12/2004 | Chang et al. | 372/20 |

FOREIGN PATENT DOCUMENTS

| | | |
|---|---|---|
| JP | 3-116992 | 5/1991 |
| JP | 04-148578 | 5/1992 |
| JP | 04-504930 | 8/1992 |
| JP | 11-163469 | 6/1999 |
| JP | 11-186648 | 7/1999 |
| JP | 11-326974 | 11/1999 |
| JP | 2000-077782 | 3/2000 |
| JP | 2001-320127 | 11/2001 |
| JP | 2002-090259 | 3/2002 |

OTHER PUBLICATIONS

Knappe et al.; "Narrow-Linewidth Fast Turntable Externalcavity Near-Infared Diode Lasers for Trace Gas Detection"; Tuesday Morning; Cleo '98; p. 93; May 5, 1998.

Michiyo Nishimura; "External-Cavity Laser Device"; JP 5-206579; Aug. 13, 1993.

Kato Takashi; "External Cavity Type Semiconductor Laser"; Patent Abstract of Japan; JP 11163471; Jun. 18, 1999.

Koji et al.; "Wavelength Variable Laser Device"; Patent Abstract of Japan; JP 20011267683; Sep. 28, 2001.

Haruo et al.; "Semiconductor Laser Capable of Changing Wavelength and External Resonance Unit"; Patent Abstract of Japan; JP 06021549; Jan. 28, 1994.

Zorabedian et al.; "Interference-Filter Tuning of a Semiconductor Laser in a Misalignment-Tolerant Degenerate External Cavity"; OFC '88/Wednesday Poster/124.

Pole; "Conjugate-Concentric Laser Resonator"; vol. 55, No. 3; Mar. 1965; pp. 254-260.

Akihiro Adachi; "Semiconductor Laser Device"; JP 2-156691; Jun. 15, 1990.

Tetsuo et al.; "Laser Oscillation Device"; Patent Abstract of Japan; JP 05-211363; Aug. 20, 1993.

Delfyett, P. J., et al., "Intracavity Spectral Shaping in External Cavity Mode-Locked Semiconductor Diode Lasers," IEEE Journal of Selected Topics in Quantum Electronics, vol. 4, No. 2, Mar./Apr. 1998, pp. 216-223.

Japanese Office Action dated Sep. 8, 2009.

* cited by examiner

*Fig. 8c*

RESONATOR

TECHNICAL FIELD OF THE INVENTION

The present invention relates to a wavelength tunable light source.

BACKGROUND ART

The market for wavelength tunable light sources, primarily tunable laser sources is currently increasing rapidly, and the use of such light sources is nowadays occurring in fields such as telecommunications. Hence, a plurality of different wavelength tunable light sources are well known in the prior art.

One such light source is disclosed in JP-0 60 21 549. This document discloses a tunable semiconductor laser, comprising a semiconductor gain element having a reflective mirrored end, and an external second mirrored end, said mirrored ends together defining a cavity. Within said cavity, two condenser lenses are arranged, and between these, a rotatable filter is arranged. By rotating said filter, the wavelength of the main lasing mode may be altered. However, this configuration comprises a plurality of components, and is therefore quite sensitive to misalignment, and at the same time expensive to manufacture. It is also difficult to make the resonator mechanically and optically stable over a long time interval. Moreover, it is complicated to achieve wavelength tuning without mode hops.

A second prior art device using the same basic principle is disclosed in "OFC '88/Wednesday poster/124 WQ27, Interference-filter tuning of a semiconductor laser in a misalignment-tolerant degenerate external cavity, P. Zorabedian, W. R. Trutna Jr". However, even if this construction is insensitive to angular misalignment of the external mirror, this type of wavelength tunable light sources has the disadvantages that they have a somewhat complex structure, and that the structure is sensitive to the individual positions of the components, and hence, component position misalignments may cause a degraded function of the light source. As the configuration above, this configuration also comprises a plurality of components, and is hence not only sensitive to component position misalignment, i.e. misalignment occurring due to relative component movements along the optical axis of the system, but is also expensive to manufacture. Moreover, it is complicated to achieve wavelength tuning free of mode hops.

An alternative resonator structure, having a more simple construction, is disclosed in "Conjugate-Concentric laser resonator, R. V. Pole, Journal of the optical society of America, Vol 55, No 3, pages 254-260". This document discloses a laser resonator being a spherical resonator, in which the active gain medium is placed centrally in the cavity and also acts like a lens so that a conjugate concentric resonator is achieved. However, this light source is not tunable, and is therefore of limited use in modern applications. Moreover, since the lens element coincides with the optical gain element, this configuration may not be used with semiconductor lasers.

Further examples of tunable external cavity configurations are the so-called Littman and Litrow configurations, which are well known for the skilled man. However, both these configurations are sensitive for misalignment, and a more stable configuration is therefore desired. Furthermore, many of the prior art configurations comprises a plurality of components, and hence suffer from drawbacks regarding misalignment losses. Also, due to the presence of several component surfaces within the cavity, the different cavities described above suffer from large resonator losses, resulting in a reduced optical power output.

SUMMARY OF THE INVENTION

Hence, an object of the present invention is to provide a wavelength tunable light source which overcomes at least some of the above drawbacks with the prior art, and provides a light source having a simple and stable construction, and which may be realised in a cost-efficient fashion.

The above objects are achieved by a wavelength tunable light source, comprising a main resonator, having a first and a second mirrored end, defining an effective cavity length, i.e. an optical beam path length of a lasing mode of the cavity, an optical gain element, having a first and a second opposing end surface, said second surface being positioned within said main resonator, a mirror element constituting said second mirrored end, and a dispersive focusing resonator element, being positioned along a beam path between said second end surface and said mirror element, whereby said effective cavity length of said main resonator is arranged to be varied. Thereby, a stable tunable resonator being insensitive to misalignments, at the same time having a simple construction may be achieved. Moreover, the tuning may be made without mode hops. Moreover, the resonator will have low losses. Furthermore, due to the resonator construction, it is possible to achieve a resonator being less sensitive to the quality of antireflection coatings on inner surfaces of the resonator, and hence achieve a resonator being suitable for mass production at low cost.

In accordance with a specially preferred embodiment of this invention, the optical gain element is a surface emitting element. In this case, the resonator will essentially be self aligning, which for example facilitates easy manufacturing and ensures a stable operation. More preferably, the second mirrored end is also arranged on the core end surface of an optical fibre. In this case, the resonator construction facilitates self-alignment so that an outgoing laser beam is automatically coupled into the optical fibre.

Other preferred embodiments of this invention, and advantages thereof, are obvious for a man skilled in the art from the remaining claims as well as the description below.

BRIEF DESCRIPTION OF THE DRAWINGS

Presently preferred embodiments of this invention will hereinafter be described with reference to the accompanying drawings.

DETAILED DESCRIPTION OF PREFERRED EMBODIMENTS OF THE INVENTION

Figure 1:
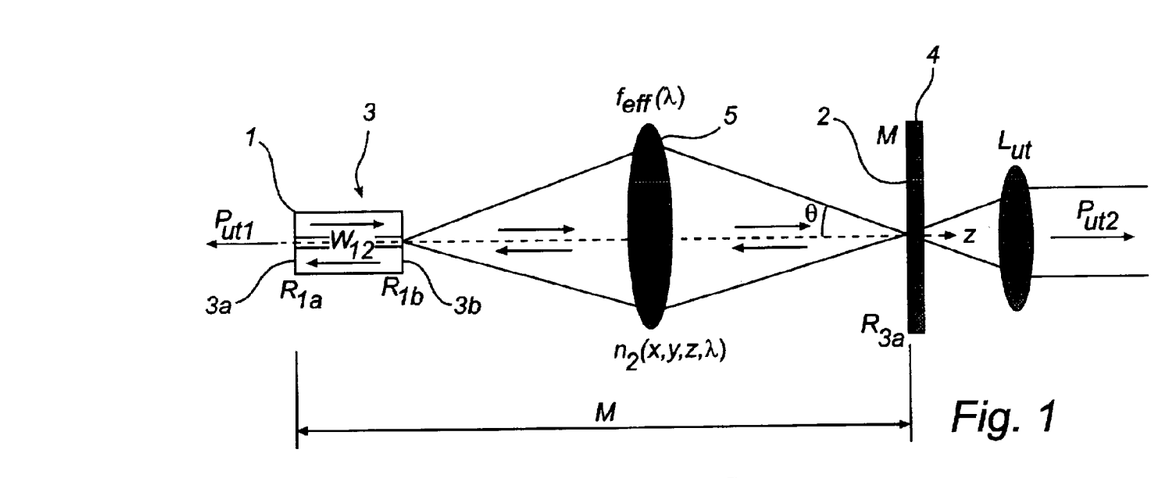
FIG. 1 is a schematic drawing of a first alternative of a first main embodiment of this invention.

A first alternative of a first main embodiment of this invention is disclosed in FIG. 1. FIG. 1 discloses a laser light source, comprising a main resonator cavity M, being defined by a first and a second mirrored end 1, 2. Within the main resonator, an optical gain element 3, here an edge emitting semiconductor element is arranged. The term edge emitting semiconductor element is to be construed as an optical gain element in which a light beam propagates in a direction that is essentially perpendicular to the surface normal of the epitaxial layers that constitute the active material of the optical gain element. The optical gain element 3 has a first and a second opposing end surface 3a, 3b, whereby said first end surface 3a in this case is arranged to constitute the first mirrored end 1 of said cavity. The second end surface 3b is positioned within the cavity, and may or may not be provided with an anti-reflection coating, as will be described below. The second mirrored end 2 of the cavity is in this case provided as a partially transmissive broadband reflection coating on a mirror element 4, having a reflectivity such that a desired, predefined proportion of the power between the two mirrored ends of the main resonator M is emitted from said mirror element 4 for all wavelengths concerned.

Figure 2:
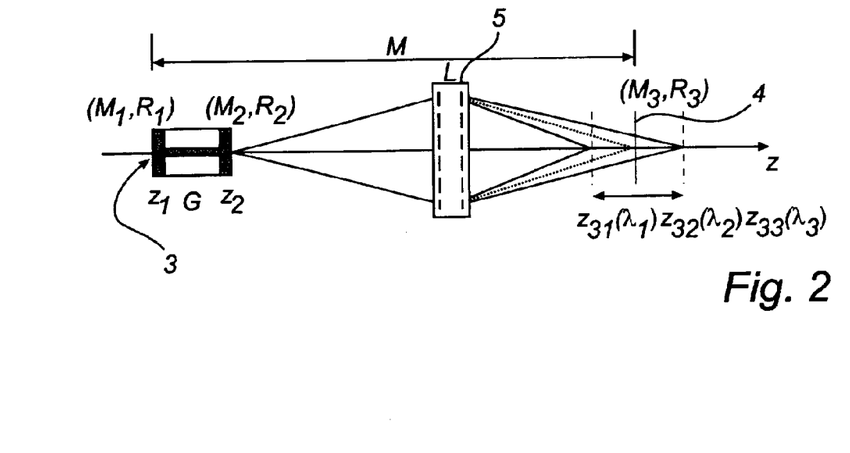
FIG. 2 is a schematic drawing showing the working principle of the present invention.

According to the invention, a dispersive, focusing element 5 is further arranged within the cavity, between said second end surface 3b of the edge emitting semiconductor element 3 and the mirror element 4. The structure of the dispersive, focusing element will be described below. The dispersive, focusing element exhibits a wavelength dependent focal distance, which generates a wavelength dependent position of an image plane of the second end of the optical gain element, as is indicated in FIG. 2. In FIG. 2, it is schematically shown that light having a first wavelength $\lambda 1$ is focused in a first plane $z_{31}$, light having a second wavelength $\lambda 2$ is focused in a second plane $z_{32}$, and light having a third wavelength $\lambda 3$ is focused in a third plane $z_{33}$. Thereby, by moving the mirror element 4 between different longitudinal positions, i.e. along the beam path of the resonator mode in question, thereby varying an effective length of the cavity, the light source may be arranged to lase at different wavelengths. The dispersive, focusing element enables a high Q value for the resonator, i.e. small losses for a narrow wavelength interval for every chosen position of the mirror element 4. Thereby, the resonator is tunably resonant for different wavelengths, merely by moving the mirror element 4 along a z-axis of said resonator for the case shown in FIG. 1 or FIG. 2. Moreover, this movement may be done without altering the total phase shift within the main resonator, i.e. free of mode hops.

Consequently, when lasing is to be achieved for a chosen wavelength, the mirror element 4 is moved to a position at which it is placed at image plane distance from the dispersive, focusing element 5 for the wavelength in question. Correspondingly, it is also possible to move other components of the resonator while maintaining the mirror element 4 in a fixed position, such as the optical gain element 3 itself relative to the focusing dispersive element, to achieve the same effect. It is also possible to move both the optical gain element and the dispersive focusing element in relation to the mirror element 4 in order to achieve the desired effect.

According to a variant of this first alternative of the first main embodiment of this invention, the mirror element 4 in the embodiment described above, may be exchanged for a mirror element having a reflection surface, the reflectance of which varies over its cross section, in such a way that it is highly reflecting for the main, lowest order mode of the cavity, while having a lower reflectance for higher order modes. Thereby, the Q value of the resonator decreases for all wavelengths in the cavity, except for the desired lasing wavelength. The reflectance is the highest in a central area of the mirror element and outside of this area, it has a lower specular reflectivity. The area of the highly reflecting surface may be chosen so that it essentially corresponds with the extension of the main mode on the mirror. In this way both axial modes, with resonant frequencies that differ from the resonance frequency of the main mode, and higher order spatial modes, if any, are suppressed. The mirror element may be designed in various ways, as long as main resonance mode experiences a higher specular reflectance than light having wavelengths falling outside the main resonance mode. The above effect may for example be achieved by applying an anti-reflection coating, an absorbing layer, a spreading, light scattering layer or a reflective or transmissive diffractive surface relief to the mirror area outside the highly reflecting area for the main mode. It shall also be noted that it is possible to use a mirror element having a reflectance that varies in other ways over its cross-section. In a general case it could be said that $R=R(x,y)$, where R is the reflectance of the mirror element, and x and y defines a coordinate system, describing the reflection surface of the mirror element. By properly designing the reflectance pattern of the mirror element, it is possible to select any mode within the cavity, not necessarily the main mode. In this case it is however necessary to choose a gain element that allows propagation of the desired mode, since the losses otherwise would be considerable.

Figure 3:
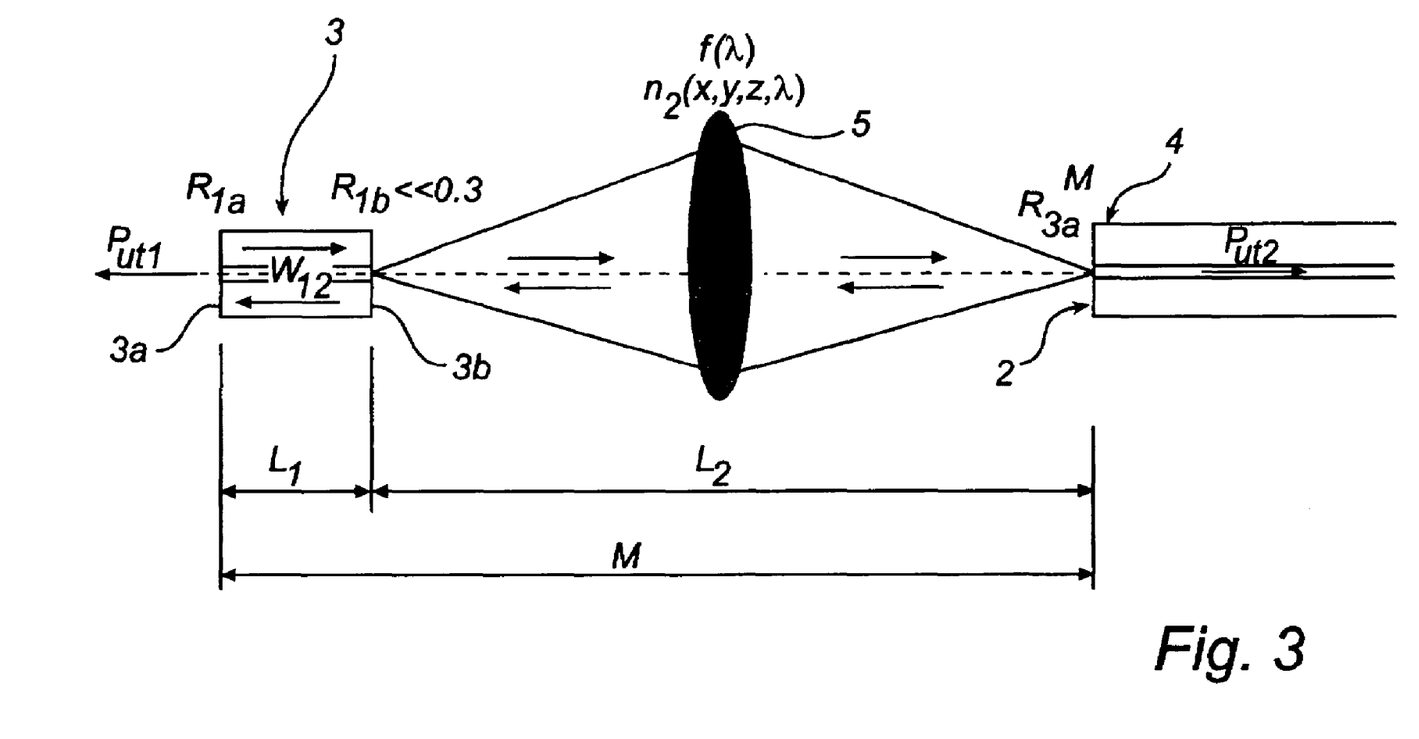
FIG. 3 is a schematic drawing of a second alternative of a first main embodiment of this invention.

According to yet a second alternative of the first main embodiment of this invention, as shown in FIG. 3, the mirror element may be arranged directly on an end surface of an optical fibre. Thereby, the light output of the light source may be directly coupled into the fibre, which may be of a single mode or multi mode type.

Figure 4:
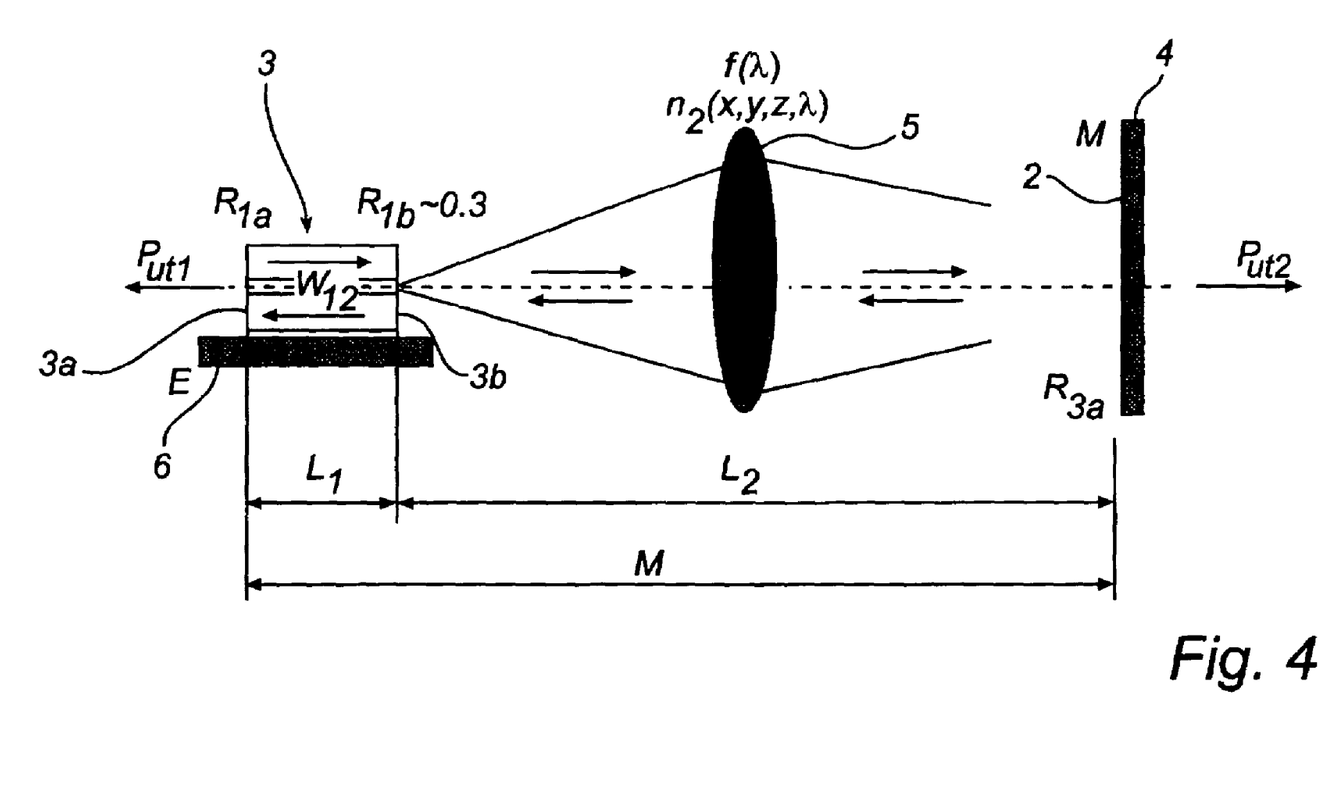
FIG. 4 is a schematic drawing of a third alternative of a first main embodiment of this invention.

According to a third alternative of the first main embodiment of this invention, as shown in FIG. 4, the second end surface 3b of the semiconductor gain element 3 may have a substantial reflectivity, such as between 20-40%, usually about 30%, which is the reflectance normally present in an interface between a semiconductor material and air, i.e. without anti-reflection coatings or the like. This embodiment further comprises means 6 for varying the optical length of the gain element, here a heating device, such as a thermoelectric element or a resistor, for heating the gain element 3, and thereby alter its optical length. Here, the main resonator comprises two coupled resonators, one being defined by the end surfaces 3a, 3b of the optical gain element 3 and the other one being defined by the second end surface 3b of the optical gain element 3 and the mirror element 4. In this embodiment, the phase relationship between the two resonators need to be controlled, whereby said heating device 6 is arranged to alter the optical path of a waveguide of said optical gain element as a function of the desired laser wavelength. It shall be noted that in this embodiment, the mirror element 4 may be of any kind described above. It shall also be noted that phase control of the mode in the optical gain element according to this alternative may be used also in cases where the reflectivity of the second end surface 3b of the semiconductor gain element 3 falls outside the above interval 20-40%. For example the above phase control may in yet a preferred embodiment be used when the above reflectivity of the second end surface 3b of the semiconductor gain element 3 lies within the interval $10^{-3}$-$10^{-2}$, in order to be able to tune the light source over a wide range of wavelengths. In this context, it shall be noted that other ways of altering the optical effective cavity length are possible by altering the refractive index of a component in the cavity, such as a separate optical plate within the cavity, whose refractive index may be altered by means of temperature changes or a varying electrical field. Another possibility is to use a gain element being subdivided into two sections, a gain section and a phase section being arranged subsequently along the optical beam path of the cavity. Thereby, the gain section is arranged to give rise to a gain and may be controlled by a gain current, while the phase section does not provide any gain, but only the ability to alter the refractive index of the phase section by controlling the section by means of a phase current. Thereby, the optical length of the gain element may be arranged to be varied by altering the optical length of the phase section.

According to yet a variant of the first main embodiment of this invention, the laser beam may be coupled out through the first mirrored end of the main cavity, i.e. in this case through the first end surface of the optical gain element. For this embodiment, the mirror element 4 is arranged to be a reflecting, partially transmitting broadband mirror, while the first end surface 3a is arranged to transmit a portion of the power as a laser beam. This variant may further be used for any of the alternative embodiments described above.

Figure 5:
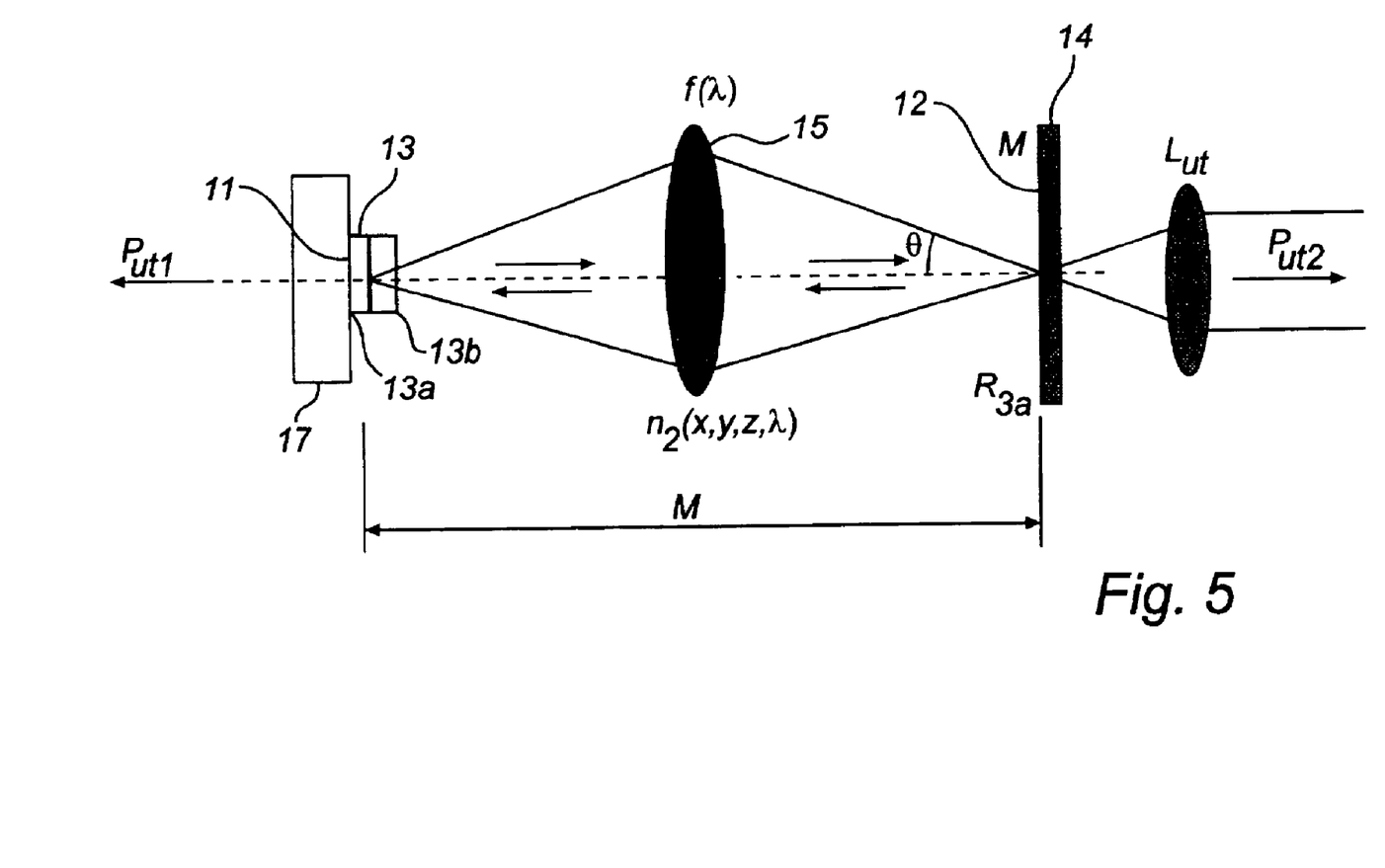
FIG. 5 is a schematic drawing of a first alternative of a second main embodiment of this invention.

A first alternative of a second main embodiment of this invention will hereinafter be described with reference to FIG. 5. FIG. 5 discloses a laser light source, comprising a main resonator cavity M, being defined by a first and a second mirrored end 11, 12. Within the main resonator M, an optical gain element 13, here a surface emitting semiconductor gain element is arranged. The term surface emitting semiconductor element is to be construed as an optical gain element in which a light beam propagates in a direction that is essentially parallel to the surface normal of the epitaxial layers that constitute the active material of the optical gain element. The optical gain element 13 has a first and a second opposing end portions 13a, 13b, whereby said first end portion 13a in this case is arranged to constitute the first mirrored end 11 of said cavity. The second end portion 13b is positioned within the cavity, and may or may not be provided with an anti-reflection coating. The second mirrored end 12 of the cavity is here provided as a partially transmissive broadband reflection coating on a mirror element 14, having a reflectivity which is chosen so that a predetermined proportion of the total optical power generated in the resonator is emitted from the second mirrored end for all wavelengths concerned. According to the invention, a dispersive, focusing element 15 as described above is further arranged within the cavity, between said second end surface of the surface emitting semiconductor gain element 13 and the mirror element 14. The structure of the dispersive, focusing element will be described below. The dispersive, focusing element exhibits a wavelength dependent distance to its image plane, as is indicated in FIG. 2. In FIG. 2, it is schematically shown that light having a first wavelength $\lambda 1$ is focused in a first plane $z_{31}$, light having a second wavelength $\lambda 2$ is focused in a second plane $z_{32}$, and light having a third wavelength $\lambda 3$ is focused in a third plane $z_{33}$. Thereby, as above, by moving the mirror element 14 between different positions along a beam path of the resonator, thereby varying an effective length of the cavity, the light source may be arranged to lase at different wavelengths. The dispersive, focusing element enables a high Q value for the resonator, i.e. small losses for a narrow wavelength interval for every chosen position of the mirror element 14. Thereby, the resonator is tunably resonant at different wavelengths, merely by moving the mirror element 14 along a z-axis of said resonator for the case shown in FIG. 5. Moreover, this movement may be done without altering the total phase shift within the main resonator, i.e. free of mode hops.

Consequently, when lasing is to be achieved for a chosen wavelength, the mirror element 14 is moved to a position at which it is placed on an image plane distance from the dispersive, focusing element 15 for the wavelength in question. Moreover, it is also possible to move other components of the cavity to achieve the same effect.

According to an alternative of this second main embodiment, the mirror element 14 may have a reflection surface, the reflectance of which varies over its cross section, in the same manner as described above. In this case, tuning of the resonator wavelength is possible without misaligning the resonator, both when the mirror element is moved laterally and/or longitudinally, i.e. when the mirror element is moved perpendicularly to and/or along the beam path of the resonator mode in question.

Figure 6:
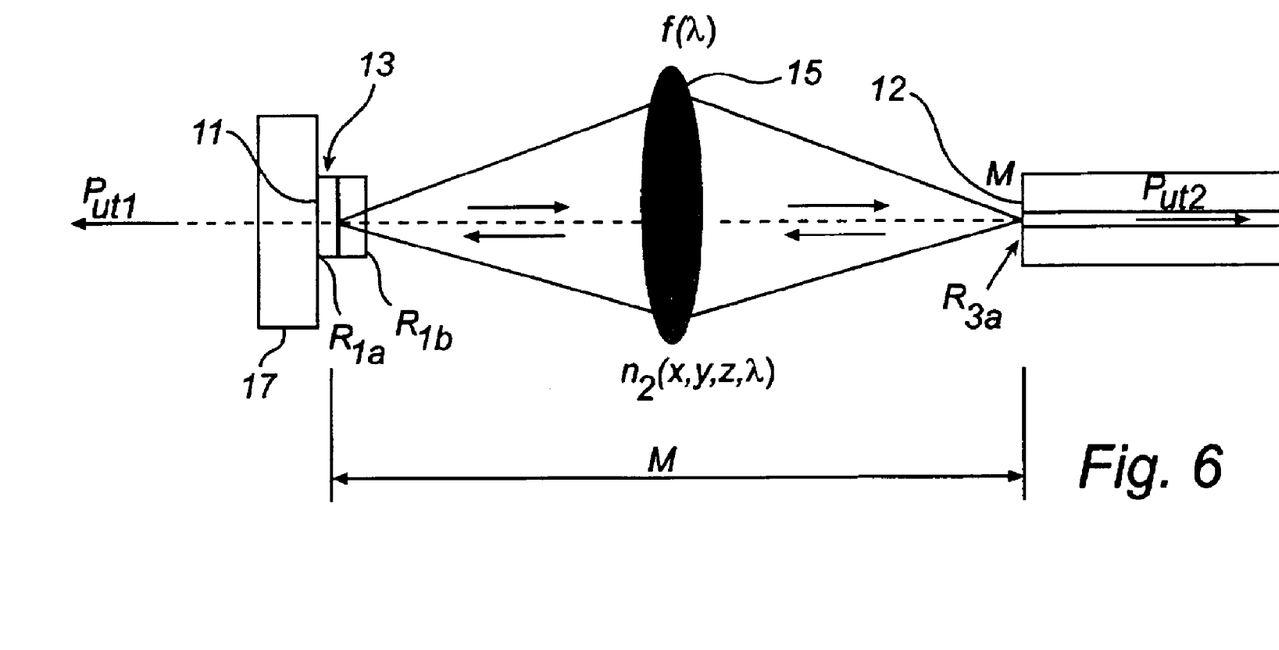
FIG. 6 is a schematic drawing of a second alternative of a second main embodiment of this invention.

According to a second alternative of a second main embodiment of the invention, as shown in FIG. 6, the mirror element of the above second main embodiment may be arranged on the end surface of a core area of an optical fibre, whereby the light output of the light source may be directly coupled into the fibre, which may be of a single mode or multi mode type. This structure enables self alignment of laser light into an optical fibre. Since the laser mode is allowed to move sideways in the surface emitting gain element and by arranging said second mirror element on the core as stated above, the lasing mode will automatically adjust to the position of the fibre core, since this is where the losses of the resonator are the smallest.

According to yet an alternative of said second main embodiment, the laser beam may be coupled out through the first mirrored end of the main cavity, i.e. in this case through the first end surface of the optical gain element. For this embodiment, the mirror element 14 is arranged to be a preferably highly reflecting, broadband mirror, while the first end surface 13a is arranged to transmit a desired predefined portion of the power as a laser beam.

Figure 8A:
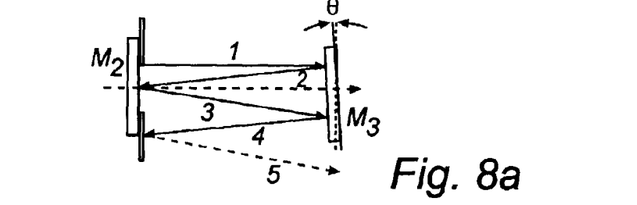
FIG. 8a is a schematic drawing showing multiple roundtrip paths of a beam that circulates in a prior art resonator.
Figure 8B:
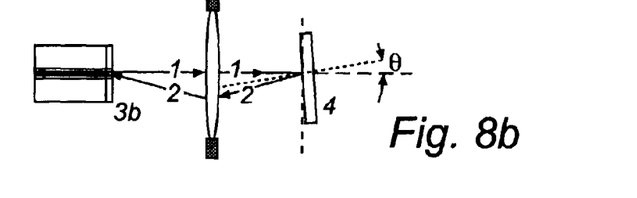
FIG. 8b is a schematic drawing showing multiple roundtrip paths of a beam that circulates in a resonator according to a first main embodiment of the invention.
Figure 8C:
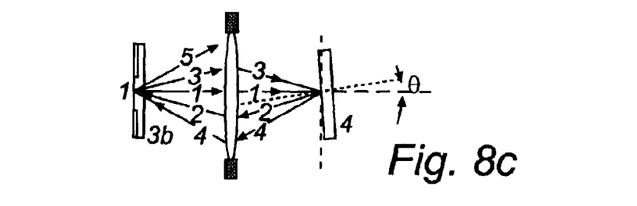
FIG. 8c is a schematic drawing showing multiple roundtrip paths of a beam that circulates in a resonator according to a second main embodiment of the invention.

It shall be noted that by the inventive arrangement, in the first main embodiment, the second end of the optical gain element is imaged on the second mirrored end of the resonator, and in the second main embodiment, the first mirrored end is imaged on the second mirrored end of the resonator, said imaging making the resonator arrangements stable. Hence, any object point on one mirror plane is imaged on the other mirror plane. This principle is illustrated in FIG. 8b for the case of the first main embodiment, where the mirror element 4 is angularly misaligned (a reference example showing a prior art resonator is disclosed in FIG. 8a). A beam labeled 1 in FIG. 8 hits a mirror element 4 and is redirected back into the resonator along the beam path labeled 2. When the beam labeled 2 reaches the surface 3b, the mode is convolved with a waveguide mode of the optical gain element and continues towards the first mirrored end 3a and is reflected within the optical gain element and is again incident on the surface 3b, whereafter the above is repeated. This may be seen as if the circulating resonator mode is spatially filtered in the waveguide/gain element, once per round trip in the resonator. In the case of the second main embodiment according to the inventive arrangement, the stability of a resonator with an angularly misaligned mirror element 4 is illustrated in FIG. 8c. The basic principle is essentially the same as described with reference to FIG. 8b above.

The first mirror element 1 may also be formed as a reflective chirped grating, i.e. a stack of reflecting layers having alternately high and low refractive indices and in which the thickness of the layers varies throughout the stack. By using such a chirped mirror element, a broadband wavelength characteristics may be achieved. The use of such a chirped grating in the end of an optical gain element waveguide does also have the advantage that it allows the waveguide length of the optical gain element to vary with the wavelength. For example, this enables that the chirped grating mirror may be designed so that the waveguide length increases/decreases with an appropriate amount in relation to the wavelength so that the total effective phase shift of the optical gain element becomes constant independent of the wavelength. This may be seen as an alternative to the embodiment shown in FIG. 4.

The dispersive, focusing element of the above embodiments will hereinafter be described in closer detail. According to a straight forward approach, the dispersive, focusing element is constituted by a single refractive positive lens element having both dispersive and focusing characteristics. The refractive index of the refractive element is dependent on the wavelength of the incident light, and thereby the dispersive effect is achieved. Alternatively, the dispersive, focusing element may be constituted by a combination of refractive lenses, together acting as a positive lens, even if one or more lenses of the combination may be negative. In this case, the focal distance of the combination varies with the wavelength of incident light. By choosing a suitable combination of materials in the combination it is possible to adjust its dispersion in order to balance the change of optical length of the resonator due to wavelength changes, and hence provide a resonator without mode hops. Moreover, the dispersive, focusing element may be constituted by one refractive and one diffractive element. This may for example be provided by means of a lens, having one refractive surface and an opposite refractive surface with a diffractive surface relief. Such an element may also be provided as a refractive lens element and a separated diffractive element, which for example may be arranged as a diffractive surface relief on an element carrying the second mirrored end (such as a glass plate on one surface having the diffractive surface relief and on the opposite surface being provided with a mirror). Such a separate diffractive element may also be separated from the second mirrored end. It shall however be noted that a certain distance must be present between the mirror and the diffractive surface relief in order to achieve the desired functionality. In the case of a non-rectilinear cavity geometry, such as a folded cavity, the dispersive focusing element may be provided as a focusing, reflecting surface, being provided with a diffractive surface relief. As yet an alternative, the dispersive focusing element may be arranged as so called GRIN element (Gradient Index element), preferably being provided with a diffractive surface relief on one of its surfaces. As another alternative, the dispersive focusing element may be constituted as a diffractive surface relief on a plane or curved surface being a part of a body carrying the mirror element 2. Moreover, it is possible to utilise a holographic optical element as the dispersive focusing element, either alone or in combination with any one of the alternatives mentioned above.

Regarding the dispersive focusing elements described above, it shall be noted that a laser will become tunable as soon as the focusing element has an adequate dispersion, irrespective of the sign of the dispersion. However, in some cases mode-hopping may be an issue. A laser free of mode-hopping may be obtained by balancing the dispersion in such a way that the resonator Q value is the largest for the wavelength dependent resonator length that corresponds with a constant phase shift within the resonator. The dispersion shall be chosen such that the waist of a mode is moved with the same velocity as the stretch of the nodal pattern along the optical axis of the cavity. The velocity of movement of the waist in relation to the wavelength may be controlled by, for a certain lens dispersion, regulating the distance between the optical gain element and the dispersive focusing element.

Figure 7:
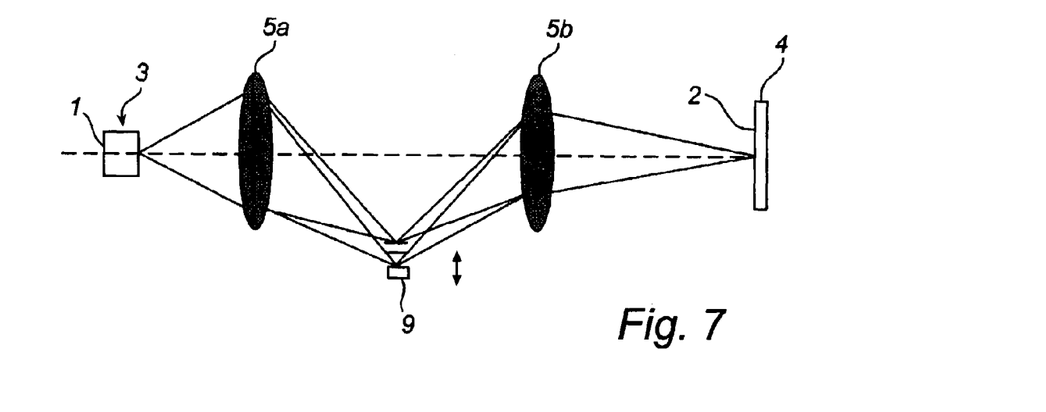
FIG. 7 is a schematic drawing of a third embodiment of this invention.

As is indicated above, the invention is not to be limited to rectilinear cavity geometries, but may in fact be implemented with any arbitrary curved or folded cavity. An example of such a cavity is shown in FIG. 7. In this case, two dispersive, focusing elements 5a, 5b, are arranged within the cavity, on a certain distance from each other. Each of the dispersive, focusing elements has a tilt dispersion with reference to an original beam path direction, i.e. the element will provide an outgoing beam having a tilted propagation direction, the tilt angle being dependent upon the wavelength of the incident light. In-between said dispersive, focusing elements, a central moveable mirror 9 is so arranged that the outgoing beam from one of the dispersive focusing elements will be reflected into the other dispersive focusing element, and the position of the mirror determines which wavelength will be reflected, whereby a tunable source, having a variable effective cavity length is provided. Preferably, the arrangement is such that any object point of the first mirrored end is imaged on not only the second mirrored end, but on the central moveable mirror as well. Thereby, a much more stable resonator is achieved. Furthermore, a man skilled in the art will easily come up with alternative folded cavity arrangements, in which the present inventive idea may be utilised. Tilt dispersion may be achieved by means of diffractive grating elements or refractive elements, such as prisms. Moreover, tilt dispersion may also be used in non-folded cavities, in which the dispersive element (for example a lens of rotational symmetry) is used "off-axis", i.e. the optical mode is arranged to enter the dispersive element at a position different than the position of the element's optical axis.

According to yet a further variant of this invention, a second dispersive, focusing element may be arranged within the cavity, whereby a spatial filtering unit, is placed between the first and second focusing elements. The spatial filtering unit may for example be provided as a pin hole element having an central aperture allowing a main, lowest order mode, to pass the pin hole element, while imposing higher losses for higher order modes. By changing the position of the pin hole element, tunability may be achieved.

Hence, in accordance with the present invention, a tunable laser source is achieved, which laser source has a tuning interval which is only limited by the spectral width of the optical gain element. In contrast, if a dispersive focusing element is not used, a tunable laser source is achieved, which source is only tunable within a narrow, limited wavelength interval (in an order of magnitude of about one free spectral width of the resonator). The laser source has an inherently simple structure and may be manufactured in a cost-efficient and compact manner. In its simplest realisation, the tunable source comprises a single diffractive element, which may be of various designs, some of which are described above, being positioned between a first and a second reflective surface, together constituting a resonator. Moreover, due to the fact that any object point on the first mirrored end, or the second end of the optical gain element, as the case may be (see above), is imaged on the second mirrored end (and reversed), the resonator is very stable and insensitive to misalignments. In the case of surface emitting elements, the cavity is even self-aligning, which facilitates manufacturing and makes the cavity less sensitive to changes due to long-term use.

Further, it shall be noted that, for simplicity, throughout the description the terms reflecting and transmitting has been used for describing characteristics of for example mirror elements. As is well known for a man skilled in the art, in reality such elements are commonly only partially reflecting and partially transmitting and such partial characteristics are included in the above definition of "reflecting" and "transmitting". Further, a man skilled in the art readily realises that the above described embodiments only are examples on how this invention may be realised. It shall be especially noted, that although the above described light sources commonly have one or two light outlets, multiple outlet cavities are possible within the range of this invention. However, commonly the light source resonator will have two light outputs, one for coupling out the laser beam, and one for coupling out for example a monitoring beam, for use in monitoring and controlling characteristics of the laser, such as power and wavelength.

It shall further be noted, that the choice of numerical aperture (NA) within the resonator, i.e. sine of the angle ($\theta$) of divergence for a mode when propagating towards the second mirror element must be done with care. If the value of NA is low, the mode selectivity of the resonator is low and if the value of NA is high, then the mode selectivity is high. Preferably, the value of NA (near the second mirror element) is chosen within the interval 0.1-0.6, even if values lying outside this interval may be used for certain applications.

Moreover, it shall be noted that the first and second end surface of the optical gain element, may be parallel or non-parallel as the case may be, and that the term opposing is intended to cover all such cases, for example where the optical gain element is somewhat curved, and the end surface planes form an angle in relation to each other. It shall also be construed that an end surface of an optical gain element may be either a surface on which a mode is internally reflected or a surface through which a mode is allowed to exit the optical gain element. Regarding the optical gain element, it shall be noted that it may be manufactured from a variety of materials, such as semiconductor materials, doped waveguide materials, such as erbium doped optical fibres, or doped solid state crystals. However, other materials may also be used. Further, it shall also be noted that pumping of the optical gain material may be made either electrically or optically, and this is not of great essence to the invention.

The light source according to the invention may be used within multiple application fields, such as telecommunications, and may for example be used in applications such as information generation and control or component testing and measurements. In the latter case the light source may be used to test and measure the wavelength characteristics of components, subsystems and larger systems within the telecommunication field. The light source may be especially useful within the WDM field, in which the light source may be set in any one of more than hundred standardised wavelengths channels in accordance with the so-called ITU-grid standard. Moreover, the light source according to the invention is also equally applicable within the field of spectroscopy, for example for detecting gases, or measuring the content of gas. The light source may also be used within the field of metrology, for example for measuring distance and/or velocity.

Finally, it shall be noted that many other modifications and alterations of this invention and its components are obvious for a man skilled in the art, when studying this disclosure and the appended claims.

The invention claimed is:

1. A wavelength tunable light source, comprising: a main resonator, having a first and a second mirrored end, defining an effective cavity length, an optical gain element, having a first and a second opposing end surface, said second surface being positioned within said main resonator, a mirror element constituting said second mirrored end, and a dispersive focusing resonator element having a diffractive surface relief, being positioned within the main resonator along a beam path between said second end surface and said mirror element and having wavelength dependent tilt dispersion, wherein said effective cavity length of said main resonator is arranged to be varied, wherein the dispersion of the dispersive focusing resonator element is chosen such that the waist of a mode is moved with the same velocity as the stretch of the nodal pattern along the optical axis of the cavity.

2. A light source according to claim 1, whereby said first mirror end of said main resonator is constituted by said first end surface of the optical gain element.

3. A light source according to claim 1, whereby the effective cavity length is arranged to be varied by varying the distance between said first and second mirrored ends taken along the beam path of said cavity.

4. A light source according to claim 3, wherein said dispersive focusing resonator element has a wavelength dependent distance to its image plane.

5. A light source according to claim 4, wherein said mirror element, constituting said second mirrored end is arranged to be positioned on image plane distance of the dispersive focusing resonator element for a wavelength at which the laser is arranged to lase.

6. A light source according to claim 1, comprising a second dispersive focusing resonator element, whereby a spatial filtering unit is placed between the first and second focusing elements.

7. A light source according to claim 1, further comprising a second dispersive focusing resonator element, whereby a deflection mirror is arranged to reflect a beam exiting from one of said dispersive focusing resonator elements before entering the other one of said dispersive focusing resonator elements, said deflection mirror being moveable in order to vary said effective cavity length.

8. A light source according to claim 1, whereby said optical gain element is constituted by a semiconductor gain element.

9. A light source according to claim 8, wherein said semiconductor gain element is constituted by a surface emitting semiconductor gain element.

10. A light source according to claim 9, having an automatically self aligning cavity, such that lasing occurs essentially independent of the individual positions of the inherent components of the light source.

11. A light source according to claim 8, wherein said semiconductor gain element is constituted by an edge emitting semiconductor element.

12. A light source according to claim 11, wherein said light source comprises a device for varying the optical length of said optical gain element, in order to control the phase of a lasing mode.

13. A light source according to claim 12, wherein the optical length of said optical gain element is arranged to be varied by regulating the temperature of the gain element.

14. A light source according to claim 12, wherein the mirror element 1 comprises a chirped axial grating, which may be designed to alter the optical length of the optical gain element.

15. A light source according to claim 12, wherein the optical gain element is subdivided into a gain section and a phase section being arranged subsequently along the optical beam path of the cavity, wherein the optical length of the gain element is arranged to be varied by altering the optical length of the phase section.

16. A light source according to claim 1, wherein the optical length of the main resonator is arranged to be varied, so that the total phase shift of the main cavity may be held at a constant value, independent of lasing wave length.

17. A wavelength tunable light source, comprising: a main resonator, having a first and a second mirrored end, defining an effective cavity length, an optical gain element, having a first and a second opposing end surface, said second surface being positioned within said main resonator, a mirror element constituting said second mirrored end, and a dispersive focusing resonator element having a diffractive surface relief, being positioned within the main resonator along a beam path between said second end surface and said mirror element, wherein the second surface of the optical gain element and the second mirrored end is arranged to be defined as optically conjugating planes, and said effective cavity length of said main resonator is arranged to be varied, wherein the dispersion of the dispersive focusing resonator element is chosen such that the waist of a mode is moved with the same velocity as the stretch of the nodal pattern along the optical axis of the cavity.

18. A light source according to claim 1, wherein said second mirrored end is arranged on an end surface of an optical fibre, in case of a surface emitting semiconductor element.

19. A light source according to claim 1, wherein the dispersive focusing resonator element is constituted by a single imaging optical component.

20. A light source according to claim 1, wherein the dispersive focusing resonator element is constituted by a combination of optical components.

21. A light source according to claim 1, wherein the effective cavity length is an optical beam path length of a resonant mode of the cavity.

22. A light source according to claim 18, wherein the end surface is a core end surface of the optical fibre.

23. A wavelength tunable light source, comprising: a main resonator, having a first and a second mirrored end, defining an effective cavity length, an optical gain element, having a first and a second opposing end surface, said second surface being positioned within said main resonator, a mirror element constituting said second mirrored end, and a dispersive focusing resonator element having a diffractive surface relief, being positioned along a beam path between said second end surface and said mirror element and having a wavelength dependent distance to its image plane, whereby said effective cavity length of said main resonator is arranged to be varied by varying the distance between said first and second mirrored ends taken along the beam path of said cavity, wherein the dispersion of the dispersive focusing resonator element is chosen such that the waist of a mode is moved with the same velocity as the stretch of the nodal pattern along the optical axis of the cavity.

24. A light source according to claim 17, whereby said first mirror end of said main resonator is constituted by said first end surface of the optical gain element.

25. A light source according to claim 17, whereby the effective cavity length is arranged to be varied by varying the distance between said first and second mirrored ends taken along the beam path of said cavity.

26. A light source according to claim 25, wherein said dispersive focusing resonator element has a wavelength dependent distance to its image plane.

27. A light source according to claim 26, wherein said mirror element, constituting said second mirrored end is arranged to be positioned on image plane distance of the dispersive focusing resonator element for a wavelength at which the laser is arranged to lase.

28. A light source according to claim 17, comprising a second dispersive focusing resonator element, whereby a spatial filtering unit is placed between the first and second focusing elements.

29. A light source according to claim 17, further comprising a second dispersive focusing resonator element, whereby a deflection mirror is arranged to reflect a beam exiting from one of said dispersive focusing resonator elements before entering the other one of said dispersive focusing resonator elements, said deflection mirror being moveable in order to vary said effective cavity length.

30. A light source according to claim 17, whereby said optical gain element is constituted by a semiconductor gain element.

31. A light source according to claim 30, wherein said semiconductor gain element is constituted by a surface emitting semiconductor gain element.

32. A light source according to claim 31, having an automatically self aligning cavity, such that lasing occurs essentially independent of the individual positions of the inherent components of the light source.

33. A light source according to claim 31, wherein said semiconductor gain element is constituted by an edge emitting semiconductor element.

34. A light source according to claim 33, wherein said light source comprises a device for varying the optical length of said optical gain element, in order to control the phase of a lasing mode.

35. A light source according to claim 34, wherein the optical length of said optical gain element is arranged to be varied by regulating the temperature of the gain element.

36. A light source according to claim 34, wherein the mirror element 1 comprises a chirped axial grating, which may be designed to alter the optical length of the optical gain element.

37. A light source according to claim 34, wherein the optical gain element is subdivided into a gain section and a phase section being arranged subsequently along the optical beam path of the cavity, wherein the optical length of the gain element is arranged to be varied by altering the optical length of the phase section.

38. A light source according to claim 17, wherein the optical length of the main resonator is arranged to be varied, so that the total phase shift of the main cavity may be held at a constant value, independent of lasing wave length.

39. A light source according to claim 17, wherein said second mirrored end is arranged on an end surface of an optical fibre, in case of a surface emitting semiconductor element.

40. A light source according to claim 17, wherein the dispersive focusing resonator element is constituted by a single imaging optical component.

41. A light source according to claim 17, wherein the dispersive focusing resonator element is constituted by a combination of optical components.

42. A light source according to claim 17, wherein the effective cavity length is an optical beam path length of a resonant mode of the cavity.

43. A light source according to claim 39, wherein the end surface is a core end surface of the optical fibre.

44. A light source according to claim 23, whereby said first mirror end of said main resonator is constituted by said first end surface of the optical gain element.

45. A light source according to claim 44, wherein said dispersive focusing resonator element has a wavelength dependent distance to its image plane.

46. A light source according to claim 45, wherein said mirror element, constituting said second mirrored end is arranged to be positioned on image plane distance of the dispersive focusing resonator element for a wavelength at which the laser is arranged to lase.

47. A light source according to claim 23, comprising a second dispersive focusing resonator element, whereby a spatial filtering unit is placed between the first and second focusing elements.

48. A light source according to claim 23, whereby said optical gain element is constituted by a semiconductor gain element.

49. A light source according to claim 48, wherein said semiconductor gain element is constituted by a surface emitting semiconductor gain element.

50. A light source according to claim 49, having an automatically self aligning cavity, such that lasing occurs essentially independent of the individual positions of the inherent components of the light source.

51. A light source according to claim 49, wherein said semiconductor gain element is constituted by an edge emitting semiconductor element.

52. A light source according to claim 51, wherein said light source comprises a device for varying the optical length of said optical gain element, in order to control the phase of a lasing mode.

53. A light source according to claim 52, wherein the optical length of said optical gain element is arranged to be varied by regulating the temperature of the gain element.

54. A light source according to claim 52, wherein the mirror element 1 comprises a chirped axial grating, which may be designed to alter the optical length of the optical gain element.

55. A light source according to claim 52, wherein the optical gain element is subdivided into a gain section and a phase section being arranged subsequently along the optical beam path of the cavity, wherein the optical length of the gain element is arranged to be varied by altering the optical length of the phase section.

56. A light source according to claim 23, wherein the optical length of the main resonator is arranged to be varied, so that the total phase shift of the main cavity may be held at a constant value, independent of lasing wave length.

57. A light source according to claim 23, wherein said second mirrored end is arranged on an end surface of an optical fibre, in case of a surface emitting semiconductor element.

58. A light source according to claim 23, wherein the dispersive focusing resonator element is constituted by a single imaging optical component.

59. A light source according to claim 23, wherein the dispersive focusing resonator element is constituted by a combination of optical components.

60. A light source according to claim 23, wherein the effective cavity length is an optical beam path length of a resonant mode of the cavity.

61. A light source according to claim 57, wherein the end surface is a core end surface of the optical fibre.

* * * * *